United States Patent
Naganawa (10) Patent No.: US 8,373,453 B2
(45) Date of Patent: Feb. 12, 2013

(54) SEMICONDUCTOR DEVICE

(75) Inventor: Masaki Naganawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/450,291

(22) Filed: Apr. 18, 2012

(65) Prior Publication Data

US 2012/0262134 A1    Oct. 18, 2012

Related U.S. Application Data (63) Continuation of application No. 12/379,683, filed on Feb. 26, 2009, now Pat. No. 8,183,891.

(30) Foreign Application Priority Data

Mar. 19, 2008    (JP) ................................. 2008-071438

(51) Int. Cl.
    *H03B 1/00*    (2006.01)
(52) U.S. Cl. ........................................ 327/108; 326/87
(58) Field of Classification Search .................. 327/108, 327/170; 326/87
    See application file for complete search history.

(56) References Cited

U.S. PATENT DOCUMENTS

| | | | |
|---|---|---|---|
| 3,138,743 A | 6/1964 | Kilby | |
| 4,710,730 A | 12/1987 | Doyle | |
| 5,696,464 A * | 12/1997 | Bartlett | 327/538 |
| 6,008,668 A | 12/1999 | Saruwatari | |
| 6,118,310 A | 9/2000 | Esch | |
| 6,222,403 B1 * | 4/2001 | Mitsuda | 327/170 |
| 6,275,439 B1 * | 8/2001 | Lee | 365/226 |
| 6,323,687 B1 * | 11/2001 | Yano | 326/83 |
| 6,356,105 B1 | 3/2002 | Volk | |
| 6,466,502 B1 | 10/2002 | Matsumoto | |
| 6,477,592 B1 | 11/2002 | Chen et al. | |
| 6,496,037 B1 | 12/2002 | Bertin et al. | |
| 6,642,083 B2 | 11/2003 | Miyazaki et al. | |
| 6,646,936 B2 * | 11/2003 | Hamamatsu et al. | 365/201 |
| 6,696,860 B2 * | 2/2004 | Lim et al. | 326/83 |
| 6,803,659 B2 | 10/2004 | Suwa et al. | |
| 6,917,556 B2 | 7/2005 | Itoh et al. | |
| 6,919,738 B2 | 7/2005 | Kushida | |
| 6,958,638 B2 * | 10/2005 | Shibata et al. | 327/170 |
| 7,463,053 B2 | 12/2008 | Chun | |
| 7,486,116 B2 * | 2/2009 | Egerer et al. | 327/108 |
| 7,498,844 B2 | 3/2009 | Rho | |
| 7,595,656 B2 | 9/2009 | Hayami | |
| 7,715,249 B2 | 5/2010 | Jeong | |
| 7,957,213 B2 * | 6/2011 | Jeong | 365/226 |

(Continued)

FOREIGN PATENT DOCUMENTS

| JP | 63-099615 A | 4/1988 |
|---|---|---|
| JP | 5-055894 A | 3/1993 |

(Continued)

OTHER PUBLICATIONS

Japanese Office Action dated Jun. 5, 2012 with English Translation.

*Primary Examiner* — Thomas J Hiltunen

(74) *Attorney, Agent, or Firm* — McGinn IP Law Group, PLLC (57) ABSTRACT

A circuit including a first buffer coupled to a power line to output a first output signal based on a data signal to an output terminal, a second buffer coupled to the power line to output a second output signal based on the data signal to the output terminal when a control signal is in a predetermined level, and a control circuit coupled to the power line and the control signal.

2 Claims, 9 Drawing Sheets

U.S. PATENT DOCUMENTS

| | | | |
|---|---|---|---|
| 8,183,891 B2 * | 5/2012 | Naganawa | 327/108 |
| 2002/0075033 A1 * | 6/2002 | Kato et al. | 326/17 |
| 2002/0180483 A1 * | 12/2002 | Lim et al. | 326/83 |
| 2003/0080780 A1 | 5/2003 | Okamoto et al. | |
| 2007/0126477 A1 * | 6/2007 | Rho | 326/82 |
| 2008/0303558 A1 | 12/2008 | Rho | |

FOREIGN PATENT DOCUMENTS

| | | |
|---|---|---|
| JP | 10-270994 A | 10/1998 |
| JP | 2003-133938 A | 5/2003 |

\* cited by examiner

| POWER SUPPLY VOLTAGE FOR I/F CIRCUIT | OUTPUT OF COMPARATOR 121 | OUTPUT OF COMPARATOR 122 |
|---|---|---|
| 3.3V | 1 | 1 |
| PROHIBIT | 1 | 0 |
| 2.5V | 0 | 1 |
| 1.8V | 0 | 0 |

SEMICONDUCTOR DEVICE

The present application is a Continuation Application of U.S. patent application Ser. No. 12/379,683, which is now U.S. Pat. No. 8,183,891, filed on Feb. 26, 2009, and claims priority from Japanese Patent Application No. 2008-071438, filed on Mar. 19, 2008, the entire contents of which is incorporated herein by reference.

BACKGROUND

1. Field of the Invention

The present invention relates to a semiconductor device, and more specifically, to a semiconductor device that automatically adjusts AC timing of an interface circuit part when a power supply voltage is changed.

2. Description of Related Art

Figure 7:
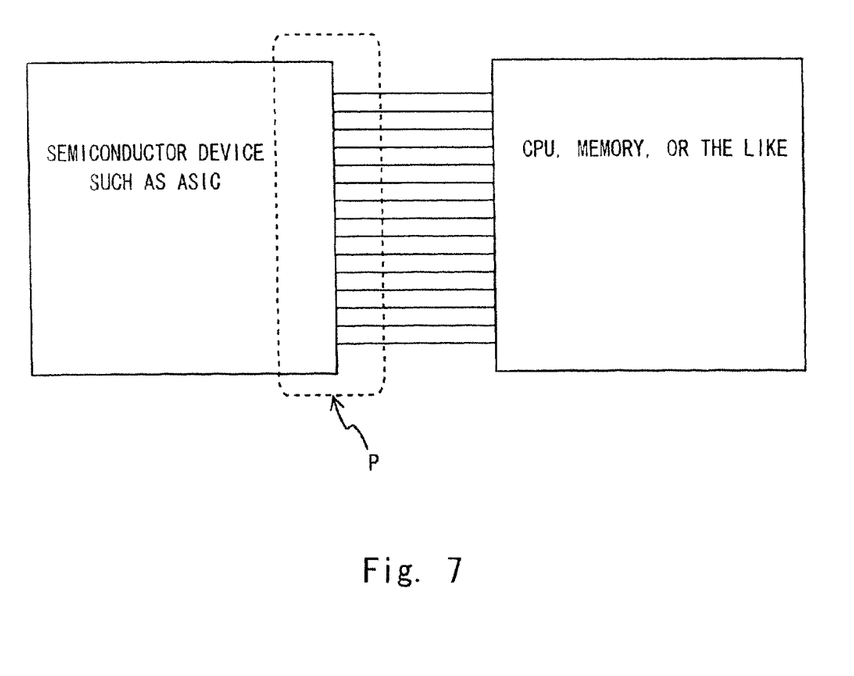
FIG. 7 is a schematic diagram showing an interface between LSIs.

In general-purpose products such as CPU, memory or the like, a power supply voltage of an interface circuit part may be changed as the performance of products (including an internal circuit) is enhanced. In this case, as shown in FIG. 7 for example, a power supply voltage in an interface (I/F) circuit part for output (P in FIG. 7) of a semiconductor device such as ASIC connected to the CPU or the memory which is the general-purpose product also needs to be changed as well.

When the power supply voltage for I/F circuit of the semiconductor device such as ASIC needs to be changed, the process of the I/F circuit part or the internal circuit such as delay adjustment for adjusting the AC timing needs to be changed. As such, the semiconductor device is often replaced with a new device which is redesigned and newly manufactured. However, this increases the number of processes due to the redesigning and increases the cost involved in the remanufacturing.

It may also be possible to use the semiconductor device without replacing the device with the new semiconductor device even when the power supply voltage for I/F circuit is changed. However, in this case, the output timing of the data signal of the I/F circuit may vary depending on the power supply voltage, which causes difference of the AC timing.

Figure 8:
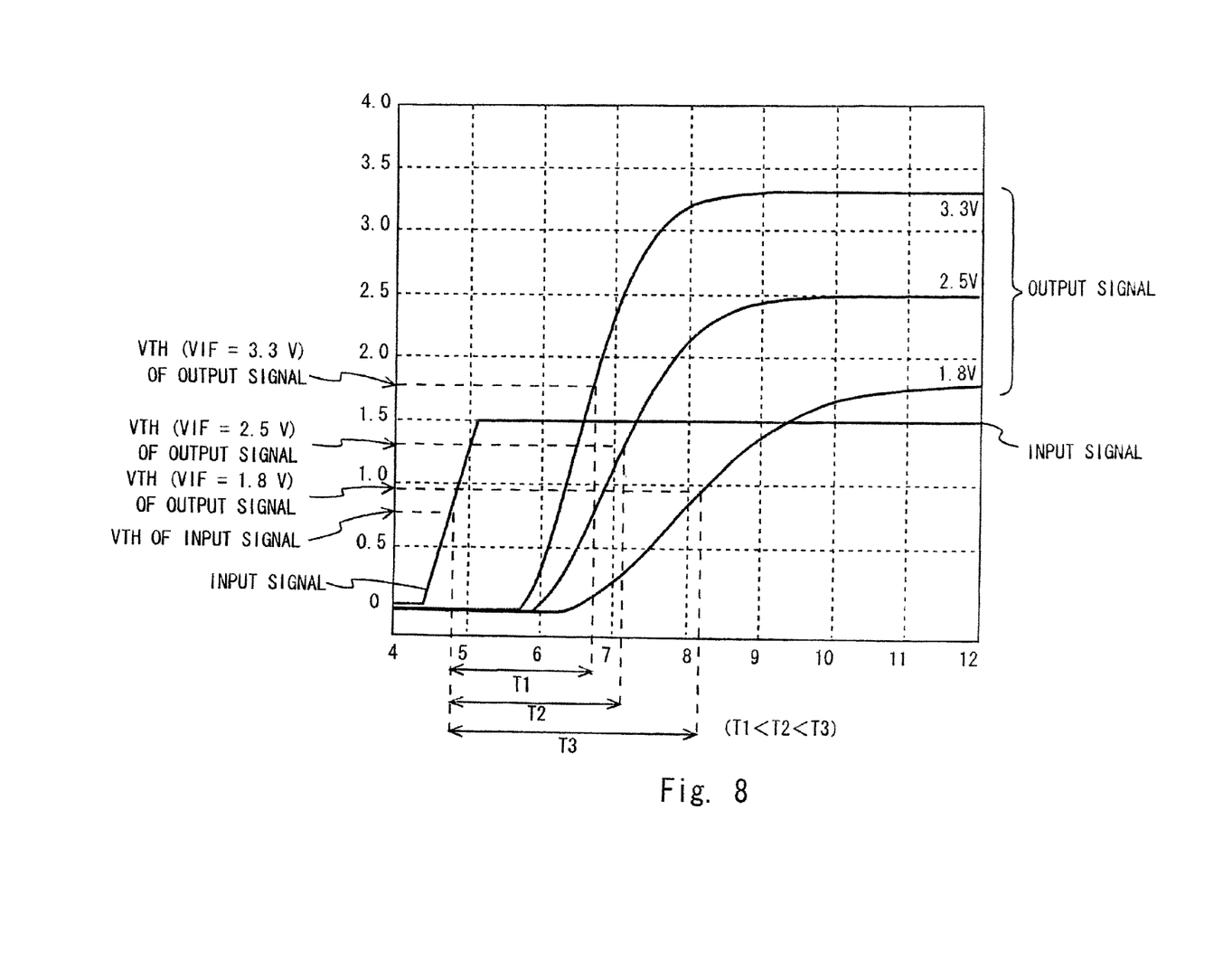
FIG. 8 shows input/output characteristics of an interface circuit for describing a problem according to a related art.

More specifically, as shown in FIG. 8, as the power supply voltage decreases, the rising of an output waveform becomes dull due to the insufficiency of the drive ability of the output buffer. For example, when the power supply voltage is decreased from 2.5 V to 1.8 V, the drive ability of the final stage transistor of the output buffer driven in this power supply voltage decreases, which causes the delay variation due to the dullness of the rising and falling of the output waveform caused by the load capacitance dependency. Thus, the delay of the output signal of the I/F circuit part increases from t1 to t3, for example, with respect to an input signal, which changes the AC timing. In order to prevent this, the circuit needs to be remanufactured after changing the type of Mox (multi oxide) transistors, or the circuit needs to be redesigned in order to adjust the delay in the internal circuit. At any rate, the circuit needs to be redesigned or remanufactured corresponding to the voltage change in accordance with the change of the power supply voltage for I/F circuit. It may also be conceived to design the semiconductor device with a timing including large margin in consideration of such a delay in advance. However, such a design may cause degradation of characteristics such as the response speed of the semiconductor device.

Figure 9:
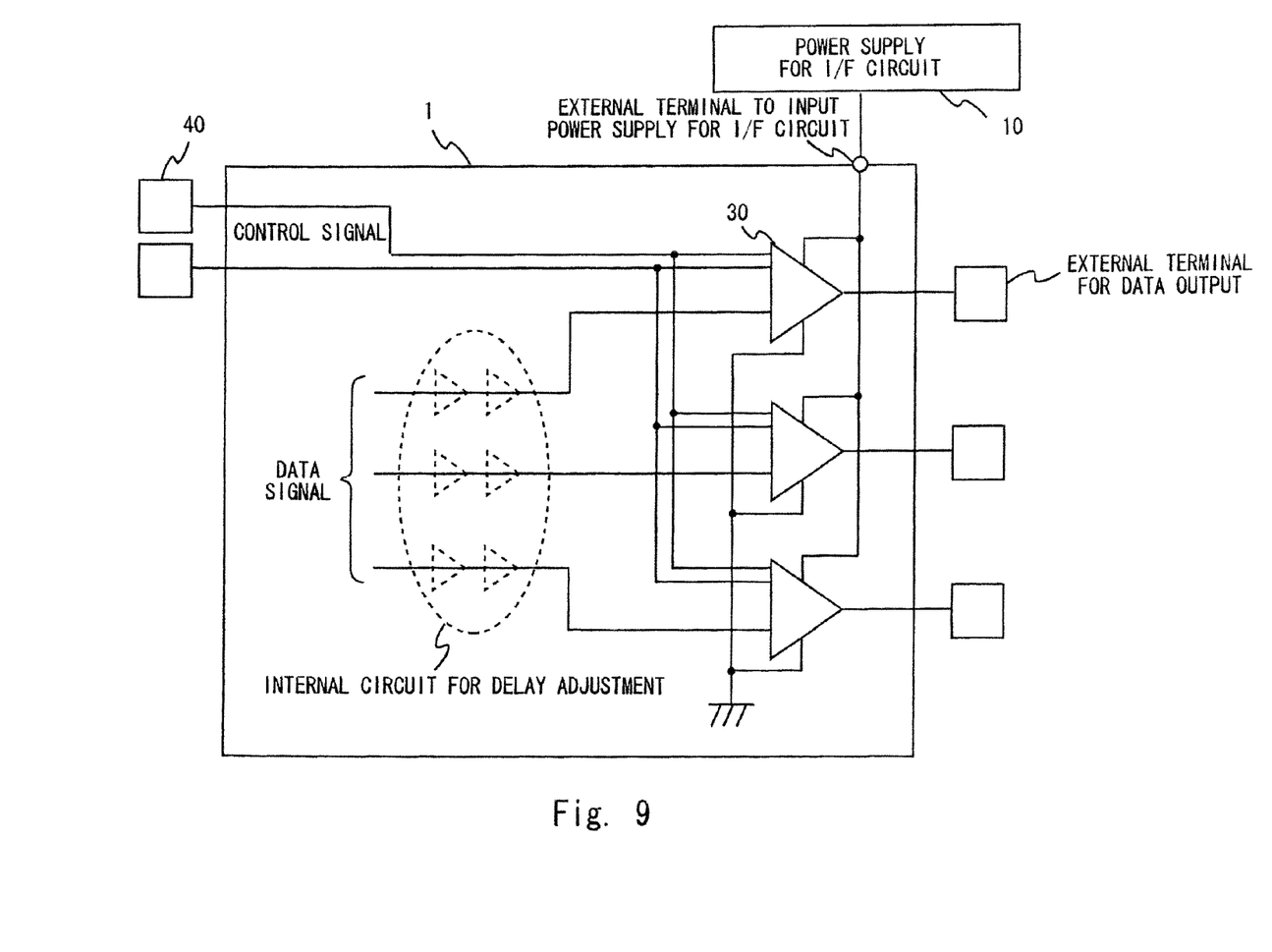
FIG. 9 is a block configuration diagram of a semiconductor device according to the related art.

Accordingly, it may be possible to use an interface circuit 30 in which the drive ability is variable on the assumption of the change of the power supply voltage for I/F in a semiconductor device 1 in advance as shown in FIG. 9. In this case, when the power supply voltage of a power supply for I/F circuit 10 is changed, the interface circuit 30 obtains a desired driving current value by changing the number of final stage transistors driven by external control signals, for example. Further, an internal circuit for delay adjustment is employed to adjust the delay time by the external set signal, for example.

Further, Japanese Unexamined Patent Application Publication No. 2003-133938 (Okamoto et al.) discloses a technique of driving an output node with optimal drive ability even when the output power supply voltage is changed.

SUMMARY

However, the present inventors have found a problem as follows. That is, as shown in FIG. 9, in the semiconductor device 1, there is a need to perform control of adjustment of current drive ability by changing the number of final stage transistors of the I/F circuit 30 from an external device in accordance with the change of the power supply voltage. To that end, an external terminal 40 or the like needs to be provided, which increases the number of external terminals of the semiconductor device 1.

Furthermore, the technique disclosed by Okamoto et al. includes an output circuit in which output driving ability is variable, but it cannot detect the change of the power supply voltage driving the transistor in the output stage.

An exemplary aspect of an embodiment of the present invention is a semiconductor device, including an interface circuit that varies drive ability according to a control signal, and a control circuit that generates the control signal according to a range of an output voltage of the interface circuit, in which the interface circuit and the control circuit are provided on one chip.

According to the semiconductor device of the present invention, it is possible to vary the drive ability of the interface circuit by the control signal generated by the control circuit in one chip.

According to the present invention, even when the power supply voltage for I/F circuit is changed, it is possible to adjust the AC timing without changing the circuit configuration or the process and without increasing the number of external terminals.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary Embodiment

Figure 1:
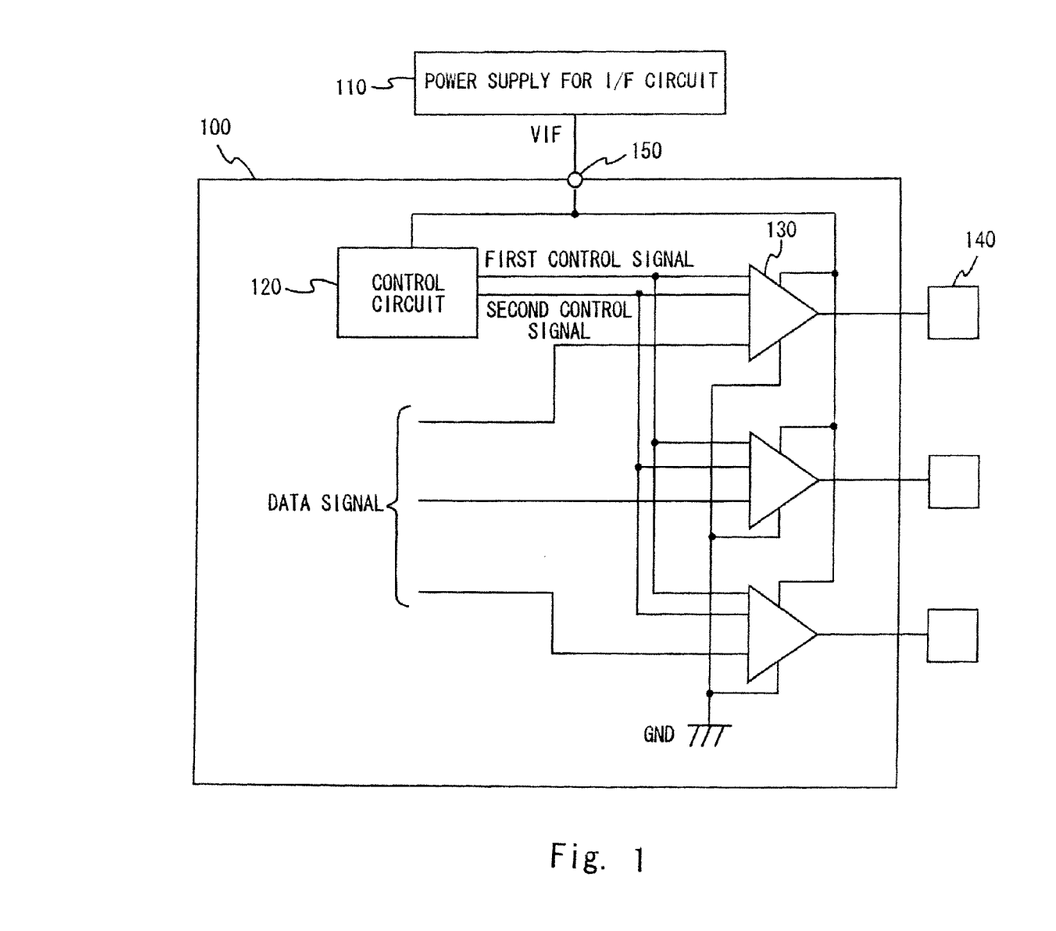
FIG. 1 is a block configuration diagram of a semiconductor device according to an exemplary embodiment.

The specific exemplary embodiment to which the present invention is applied will now be described in detail with reference to the drawings. As shown in FIG. 1, a semiconductor device 100 of the exemplary embodiment includes a control circuit 120 and an I/F circuit 130. The control circuit 120 and the I/F circuit 130 are formed on one chip. Further, the semiconductor device 100 is connected to a power supply for interface (I/F) circuit 110 by an external terminal 150.

The power supply for I/F circuit 110 is connected to the control circuit 120 and the I/F circuit 130 through the external terminal 150, and supplies a power supply voltage for I/F circuit (hereinafter referred to as power supply voltage for I/F circuit Vif). This power supply voltage for I/F circuit Vif is changed in accordance with the change of the I/F power supply voltage of general-purpose products such as CPU, memory or the like. The variant example of the I/F power supply voltage includes 3.3 V, 2.5 V, 1.8 V or the like, for example. The power supply for I/F circuit 110 may be provided inside the semiconductor device 100 to supply the power supply voltage for I/F circuit Vif to the control circuit 120 and the I/F circuit 130.

The control circuit 120 detects the change of the power supply voltage for I/F circuit Vif, and outputs first and second control signals to the I/F circuit 130. The control circuit 120 includes resistance elements R1 to R9, comparators 121, 122, and latch circuits 123, 124. The resistance elements R1 to R9 are the same elements and have the same shape in designing the semiconductor device. In other words, the resistance elements R1 to R9 all have the same resistance value, and do not depend on absolute variation of the resistance value. Further, the resistance elements R1 to R9 are locally arranged so that they are arranged as close as possible with each other on the semiconductor chip in order to suppress relative variation between elements.

Figure 2:
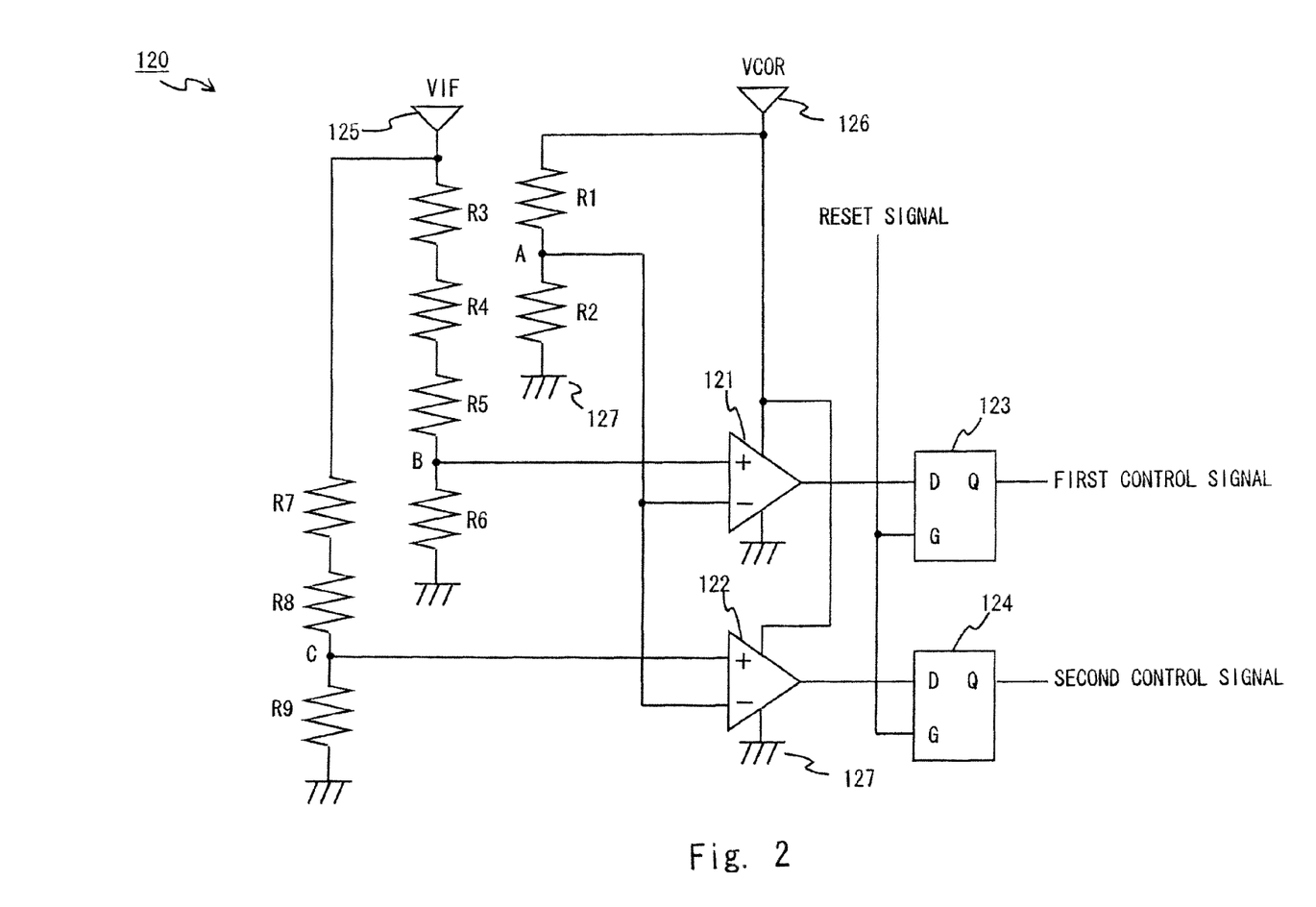
FIG. 2 is a detailed circuit configuration diagram of a control circuit according to the exemplary embodiment.

FIG. 2 shows a detailed circuit configuration of the control circuit 120. As shown in FIG. 2, the resistance elements R1 and R2 are connected in series between a core power supply voltage terminal 126 and a ground voltage terminal 127 (ground voltage GND). The resistance element R1 is connected between the core power supply voltage terminal 126 and a node A, and the resistance element R2 is connected between the node A and the ground voltage terminal 127. The core power supply voltage terminal 126 supplies a core power supply voltage Vcor for a range which does not change voltage of the semiconductor device 100. Accordingly, the voltage of the node A has a value obtained by dividing the core power supply voltage Vcor into ½ by the resistance elements R1 and R2.

The resistance elements R3 to R6 are connected in series between the power supply voltage terminal for I/F circuit 125 and the ground voltage terminal. The resistance element R3 is connected between the power supply voltage terminal for I/F circuit 125 and the resistance element R4, the resistance element R4 is connected between the resistance element R3 and the resistance element R5, the resistance element R5 is connected between the resistance element R4 and a node B, and the resistance element R6 is connected between the node B and the ground voltage terminal 127. The power supply voltage terminal for I/F circuit 125 supplies the power supply voltage for F circuit Vif supplied from the power supply for I/F circuit 110 of FIG. 1. Accordingly, the voltage of the node B has a value obtained by dividing the power supply voltage for I/F circuit Vif into ¼ by the resistance elements R3 to R6.

The resistance elements R7 to R9 are connected in series between the power supply voltage terminal for I/F circuit 125 and the ground voltage terminal 127. The resistance element R7 is connected between the power supply voltage terminal for I/F circuit 125 and the resistance element R8, the resistance element R8 is connected between the resistance element R7 and a node C, and the resistance element R9 is connected between the node C and the ground voltage terminal 127. Accordingly, the voltage of the node C has a value obtained by dividing the power supply voltage for I/F circuit Vif into ⅓ by the resistance elements R7 to R9.

The comparator 121 has a non-inverting input terminal connected to the node B and an inverting input terminal connected to the node A. Accordingly, when the potential of the node B is higher than that of the node A, the comparator 121 outputs "1" (potential is in high level) signal. On the other hand, when the potential of the node B is lower than that of the node A, the comparator 121 outputs "0" (potential is in low level) signal. The output terminal of the comparator 121 is connected to the input terminal of the latch circuit 123. The comparator 122 has a non-inverting input terminal connected to the node C, and an inverting input terminal connected to the node A. Accordingly, when the potential of the node C is higher than that of the node A, the comparator 122 outputs "1" (potential is in high level) signal. On the other hand, when the potential of the node C is lower than that of the node A, the comparator 122 outputs "0" (potential is in low level) signal. Note that the output terminal of the comparator 122 is connected to the input terminal of the latch circuit 124. High potential side power supply terminals of the comparators 121 and 122 are connected to the core power supply voltage terminal 126, and low potential side power supply terminals are connected to the ground voltage terminal 127.

Figure 3:
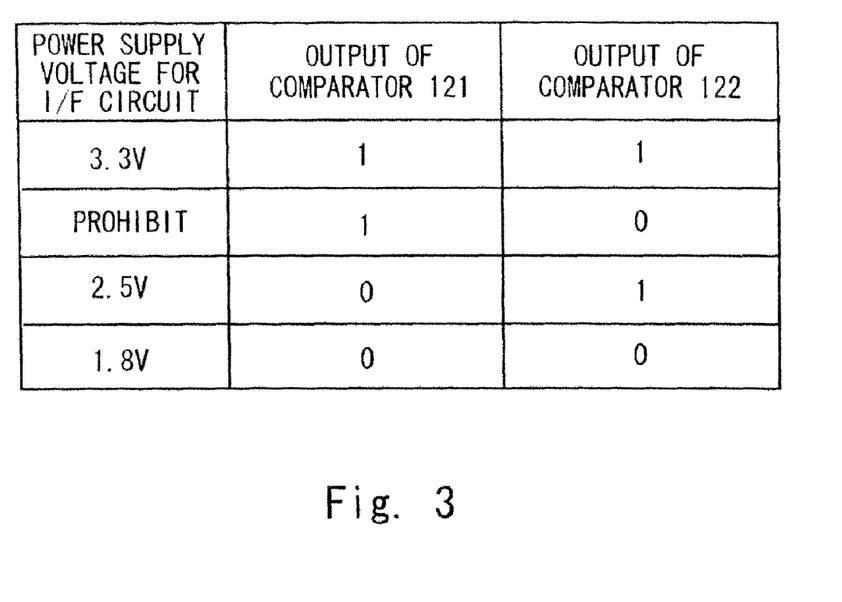
FIG. 3 is a combination table of control signals output from the control circuit according to the exemplary embodiment.

FIG. 3 shows one example of a relation between the power supply voltage for I/F circuit Vif and the outputs of the comparators 121, 122. The power supply voltage for I/F circuit Vif is 3.3V, 2.5V, 1.8V, and the core power supply voltage Vcor is 1.5V, as an example. As there is no relation in which the output values of the comparators 121, 122 become "1" and "0", respectively, this combination is shown as "prohibit".

The latch circuit 123 has an input terminal connected to an output terminal of the comparator 121, and an output terminal outputting a first control signal of the control circuit 120 to the I/F circuit 130. The latch circuit 124 has an input terminal connected to an output terminal of the comparator 122, and an output terminal outputting a second control signal of the control circuit 120 to the I/F circuit 130. Further, the latch circuits 123, 124 are formed of D latches or the like, and each of the latch circuits 123, 124 has a control terminal G to which a reset signal or the like of the semiconductor device 100 is input.

Figure 4:
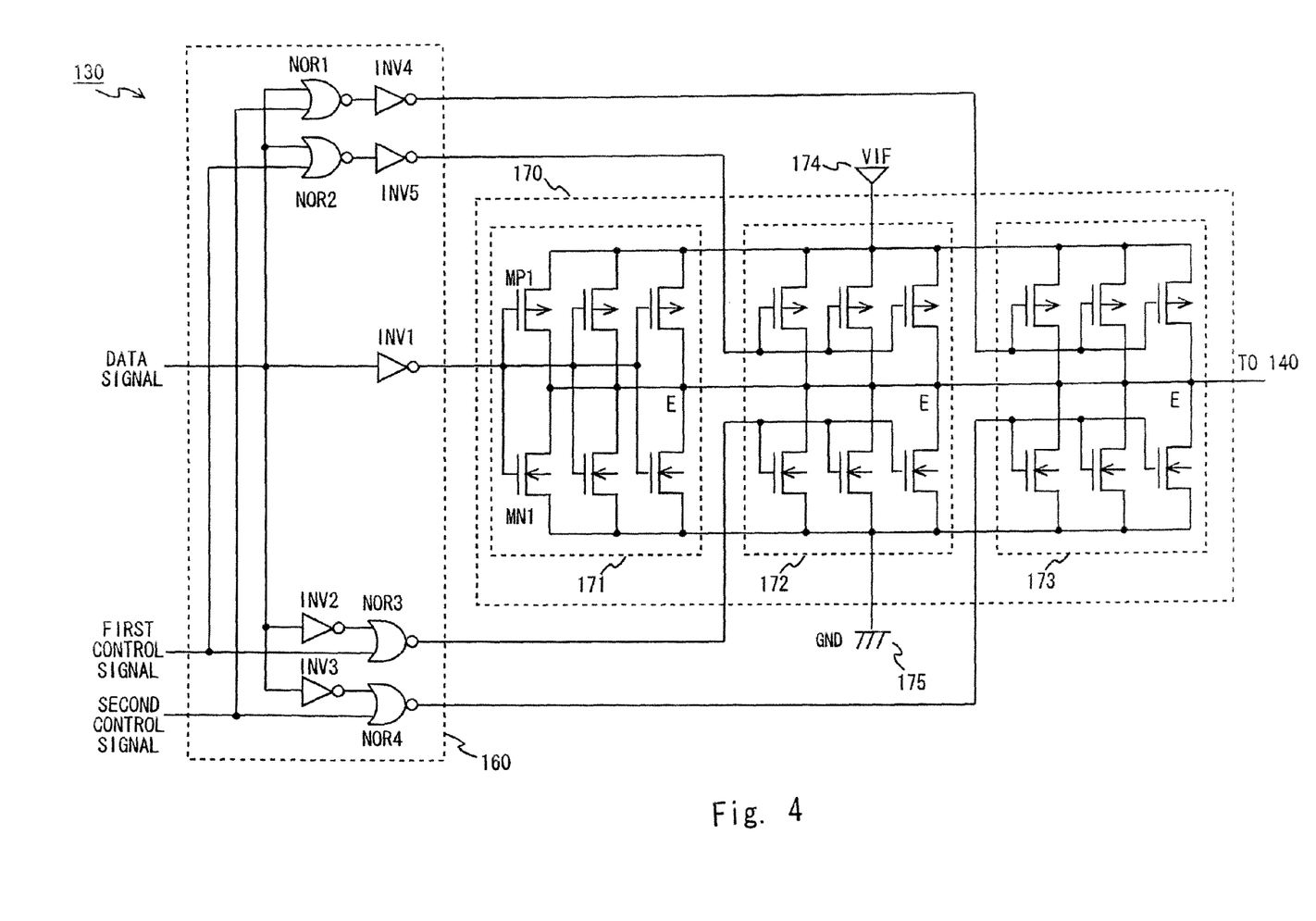
FIG. 4 is a detailed circuit configuration diagram of an interface circuit according to the exemplary embodiment.

The I/F circuit 130 amplifies the input data signal and outputs the amplified signal to the external terminal 140. This output signal is amplified up to the power supply voltage for I/F circuit Vif applied to the I/F circuit 130 as a maximum value. FIG. 4 shows a detailed circuit configuration of the I/F circuit 130. As shown in FIG. 4, the I/F circuit 130 includes a pre-buffer part 160 and a main buffer part 170.

The pre-buffer part 160 includes inverter circuits Inv1 to Inv5, and NOR circuits NOR1 to NOR4.

The main buffer 170 includes buffer units 171 to 173. Each of the buffer units 171 to 173 includes a plurality of inverter buffer circuits having outputs connected to one node E. Further, the node E is connected to the external terminal 140. Each of the inverter buffer circuits has a PMOS transistor MP1 and an NMOS transistor MN1. The PMOS transistor MP1 has a source connected to the power supply voltage terminal for I/F circuit 174 and a drain connected to the node E, and the NMOS transistor MN1 has a source connected to a GND terminal 175 and a drain connected to the node E.

The data signal is input to the input terminals of the inverter circuits Inv1 to Inv3, and one input terminal of each of the NOR circuits NOR1 and NOR2. Each output of the inverter circuits Inv2 and Inv3 is input to one input terminals of the NOR circuits NOR3 and NOR4, respectively. The first control signal is input to the other input terminal of each of the NOR circuits NOR2 and NOR3. The second control signal is input to the other input terminal of each of the NOR circuits NOR1 and NOR4. Each output of the NOR circuits NOR1 and NOR2 is input to the input terminals of the inverter circuits Inv4 and Inv5, respectively.

An output of the inverter circuit Inv1 is input to the gates of the PMOS transistor MP1 and the NMOS transistor MN1 of each of the plurality of inverter buffer circuits of the buffer unit 171. An output of the inverter circuit Inv5 is input to a gate of the PMOS transistor MP1 of each of the plurality of inverter buffer circuits of the buffer unit 172. An output of the inverter circuit Inv4 is input to a gate of the PMOS transistor MP1 of each of the plurality of inverter buffer circuits of the buffer unit 173. An output of the NOR circuit NOR3 is input to a gate of the NMOS transistor MN1 of each of the plurality of inverter buffer circuits of the buffer unit 172. An output of the NOR circuit NOR4 is input to a gate of the NMOS transistor MN1 of each of the plurality of inverter buffer circuits of the buffer unit 173.

From the circuit configuration as above, in the I/F circuit 130, it is controlled whether the buffer units 172 and 173 are to be driven according to the first and second control signals from the control circuit 120. For example, when each of the values of the first and second control signals is "1", the buffer units 172 and 173 are not driven. On the other hand, when each of the values of the first and second control signals is "0", the buffer units 172 and 173 are driven. In summary, the I/F circuit 130 is able to change the drive ability of the main buffer part according to the first and second control signals.

Figure 5:
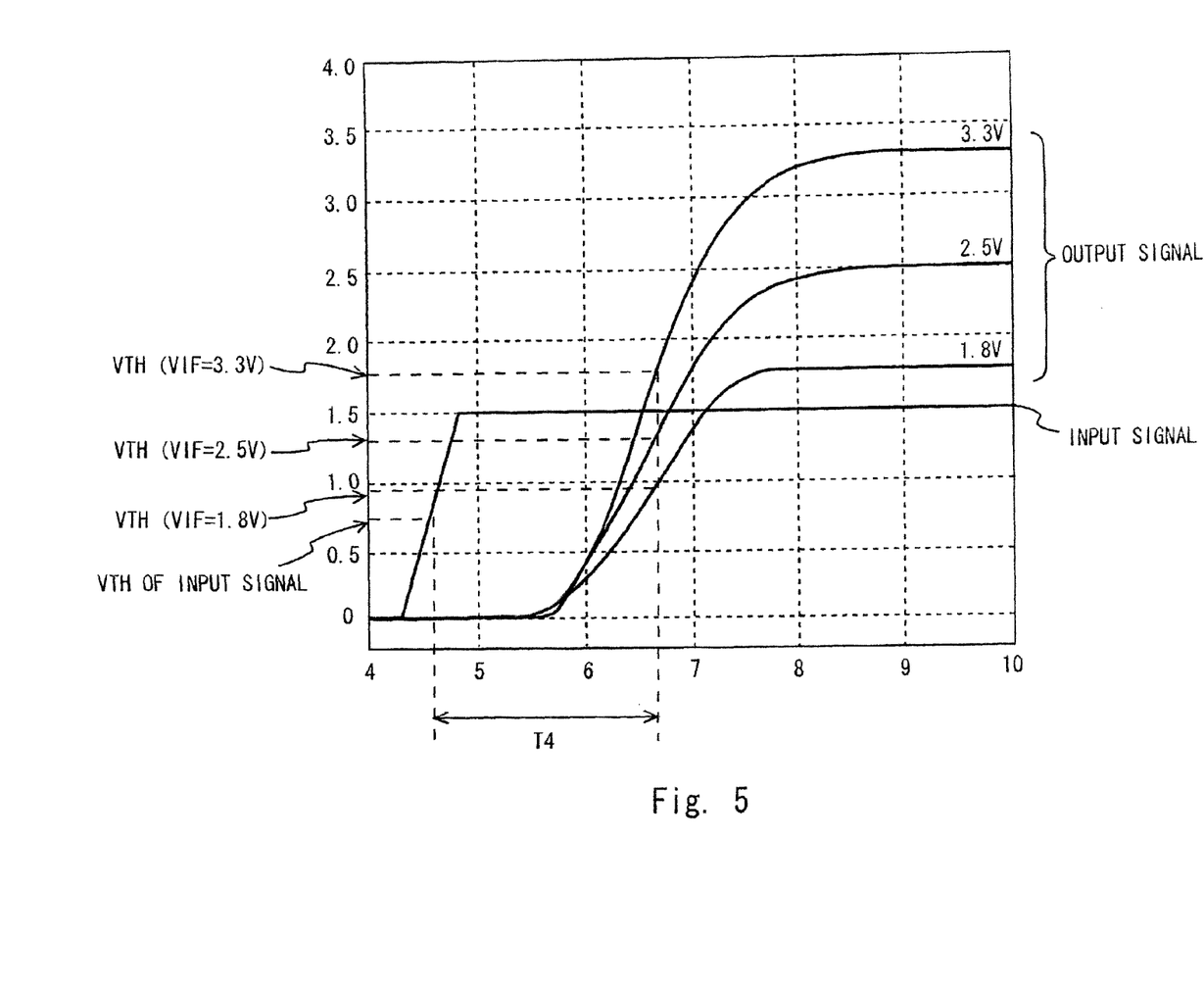
FIG. 5 shows input/output characteristics of the interface circuit according to the exemplary embodiment.

The I/F circuit 130 changes the drive ability of the main buffer part according to the first and second control signals as described above. As such, the I/F circuit 130 is designed so that the difference is made small between the power supply voltages which can set the transmit delay of the circuit unit in advance. More specifically, as shown in FIG. 5, even when the power supply voltage for I/F circuit Vif changes as 3.3 V, 2.5 V, 1.8 V, the delay t4 of the output signal of the I/F circuit 130 is made constant with respect to the input signal.

The operation of the semiconductor device 100 having the circuit configuration as above will be described. Note that, the core power supply voltage Vcor is fixed to 1.5 V. Further, the power supply voltage for I/F circuit Vif is changed as 3.3 V, 2.5 V, 1.8 V.

As shown from the circuit configuration of the control circuit 120 of FIG. 2, since the core power supply voltage Vcor is constant, the voltage of the node A is 0.75 V, which is the constant value. As the power supply voltage for I/F circuit Vif is divided into ¼ by the resistance elements R3 to R6, the voltage of the node B is 0.825 V when the power supply voltage for I/F circuit Vif is 3.3 V, 0.625 V when the Vif is 2.5 V, and 0.45 V when the Vif is 1.8 V. From the relation of the voltages between the node A and the node B, the output of the comparator 121 is "1" when the power supply voltage for I/F circuit Vif is 3.3 V, "0" when the Vif is 2.5 V, and "0" when the Vif is 1.8 V.

On the other hand, as the power supply voltage for I/F circuit Vif is divided into ⅓ by the resistance elements R7 to R9, the voltage of the node C is 1.1 V when the power supply voltage for I/F circuit Vif is 3.3 V, 0.833 V when the Vif is 2.5 V, and 0.6 V when the Vif is 1.8 V. From the relation of the voltages between the node A and the node C, the output of the comparator 122 is "1" when the power supply voltage for I/F circuit Vif is 3.3 V, "1" when the Vif is 2.5 V, and "0" when the Vif is 1.8 V.

Accordingly, the relation of the power supply voltage for I/F circuit Vif and the outputs of the comparators 121 and 122 are shown in a table in FIG. 3, as described above. Further, as there is no relation in which the output values of the comparators 121 and 122 becomes "1" and "0", respectively, this combination is shown as "prohibit". The output values from the comparators 121 and 122 are the first and second control signals after passing through the latch circuits 123 and 124. As stated above, the control circuit 120 detects the voltage value of the power supply voltage for I/F circuit Vif and transmits the detection result to the I/F circuit 130 as the first and second control signals.

Next, the first and second control signals, which are the detection result of the control circuit 120, are input to the I/F circuit 130, and the drive ability of the main buffer part is changed according to the values of the first and second control signals. For example, when both of the first and second control signals are "1" (power supply voltage for I/F circuit Vif is 3.3 V), the buffer units 172 and 173 are not driven, but only the buffer unit 171 is driven. Further, when the first control signal is "0" and the second control signal is "1" (power supply voltage for I/F circuit Vif is 2.5 V), the buffer unit 173 is not driven, but the buffer units 171 and 172 are driven. Further, when the first and second control signals are "0" (power supply voltage for I/F circuit Vif is 1.8 V), all of the buffer units 171 to 173 are driven.

By changing the drive ability of the main buffer part 170, it is possible to suppress the delay variations due to the dullness of the rising and falling of the output waveforms caused by the load capacitance dependency due to the change of Vif, which is the problem shown in FIG. 8 (see FIG. 5). Further, by changing the drive ability of the main buffer part 170, it is possible to prevent overshoot and undershoot when the power supply voltage for I/F circuit Vif of the I/F circuit 130 is made high. Further, the full swing operation is made possible even when the power supply voltage for I/F circuit Vif is low.

Note that the latch circuits 123 and 124 latch the output values of the comparators 121 and 122 in synchronization with the reset signal of the semiconductor device 100 input to the control terminals G, and output the values as the first control signal and the second control signal. By providing the latch circuits 123 and 124, it is possible to prevent false detection of the control circuit 120 due to the variations of the power supply voltage in the real operation of the semiconductor device 100.

For example, when both of the core power supply voltage Vcor and the power supply voltage for I/F circuit Vif are not stabilized and supplied from a general mounting board in a device, the voltage value may swing in a certain range (about ±10%, for example) in operating the device. In this case, the voltage values of the nodes A to C, which are resistance-divided voltages of the core power supply voltage Vcor and the power supply voltage for I/F circuit Vif also swing in accordance with it.

We now assume a case in which the instantaneous core power supply voltage Vcor is changed from 1.5 V to 1.65 V, which is +10% higher, and the instantaneous power supply voltage for I/F circuit Vif is changed from 3.3 V to 3.0 V, which is −10% lower as an example when the device is operated. In this case, the voltage of the node A is 0.825 V, the voltage of the node B is 0.75 V, and the voltage of the node C is 1.0 V. Thus, although the control circuit 120 should detect that the power supply voltage for I/F circuit Vif is 3.3 V, it falsely detects that the Vif is 2.5V. Thus, the latch circuits 123 and 124 hold the outputs of the comparators 121 and 122 after latching them with the reset signal or the like used for activating the device where the swing of the power supply is relatively small, so that the set value of the control circuit 120 does not dramatically change in accordance with the swing of the power supply in activating the device as described above.

Figure 6:
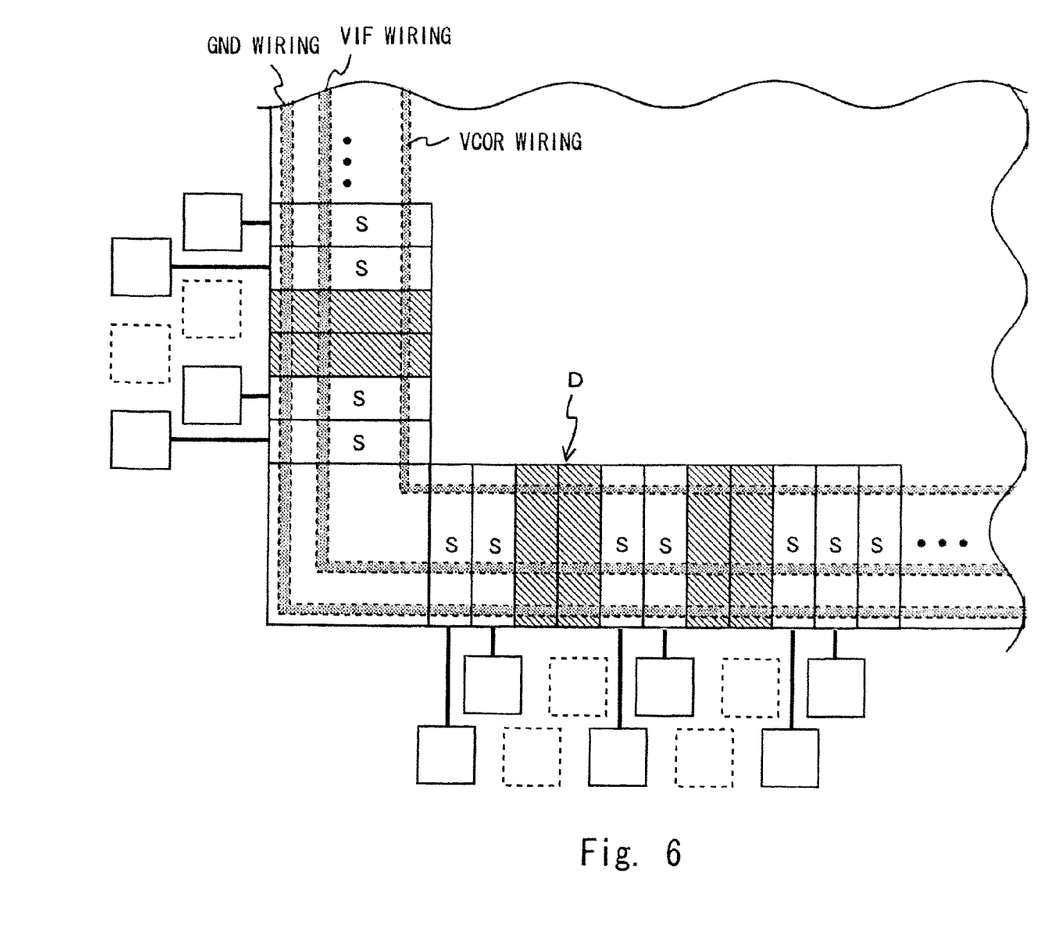
FIG. 6 is a schematic diagram of a chip end of the semiconductor device according to the exemplary embodiment.

Further, the control circuit 120 according to the exemplary embodiment does not require the control signal from the external device to the I/F circuit when the power supply voltage for I/F circuit is changed as described in FIG. 9. Accordingly, as the external terminal for inputting the external control signal is not needed, the control circuit 120 can be arranged in a position which would have been a dead space in the semiconductor chip such as a region D in FIG. 6. Further, the power supply voltage for I/F circuit Vif, the core power supply voltage Vcor, and the ground voltage GND are supplied to the control circuit 120 in the region D by wirings in a layer different from the layer in which the control circuit 120 is formed. The region D is the IO slot region in which pads for input and output signals cannot be arranged because of the constraints in assembling the device: the bonding is impossible, for example. Accordingly, by using the control circuit 120 of the exemplary embodiment, the above dead space can be effectively used, and the chip area can be prevented from being increased or can even be decreased. Note that the region S in FIG. 6 is the IO slot region of the chip.

As described above, according to the semiconductor device of the exemplary embodiment, when the power supply voltage in the I/F circuit part is changed, it is possible to adjust the AC timing between the LSIs such as ASIC and CPU without changing the circuit configuration, the process, and without increasing the external terminals.

Note that the present invention is not limited to the above-described exemplary embodiment, but may be changed as appropriate without departing from the spirit of the present invention. For example, although the two control signals are input to the I/F circuit 130 in the above exemplary embodiment, more than two control signals may be input. In this case, it is possible to respond to the finer change of the power supply voltage for I/F circuit Vif. In this case, the number of comparators and the number of resistance elements or the like dividing the power supply voltage for I/F circuit Vif in the control circuit 120 increase in accordance with the increase of the number of control signals.

Furthermore, although the resistance elements R1 to R9 are formed by the same layout in the above-described exemplary embodiment, for example, only one resistance element may be employed so that the resistance value becomes equal to the sum of the resistance elements R3 to R5. Similarly, only one resistance element may be employed so that the resistance value is equal to the sum of the resistance elements R7 and R8. However, it should be noted that the variations of the ratio of the resistance values needs to be paid attention to.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A circuit comprising:
    a first buffer coupled to a power line to output a first output signal based on a data signal to an output terminal;
    a second buffer coupled to the power line to output a second output signal based on the data signal to the output terminal when a control signal is in a predetermined level;
    a control circuit coupled to the power line and the control signal,
    wherein the control circuit is configured to control the control signal in response to an electric potential of the power line; and
    a third buffer coupled to the power line to output a third output signal based on the data signal to the output terminal in response to another control signal,
    wherein the control circuit is configured to control the other control signal in response to the electric potential of the power line, and
    wherein the control circuit comprises a plurality of comparators powered by another power line.

2. A circuit comprising:
    a first buffer coupled to a power line to output a first output signal based on a data signal to an output terminal;
    a second buffer coupled to the power line to output a second output signal based on the data signal to the output terminal when a control signal is in a predetermined level;
    a control circuit coupled to the power line and the control signal,
    wherein the control circuit controls the control signal to the predetermined level when the electric potential of the power line is no higher than a first electric potential,
    wherein the control circuit controls the control signal to another predetermined level when the electric potential of the power line exceeds the first electric potential; and
    a third buffer coupled to the power line to output a third output signal based on the data signal to the output terminal when another control signal is in the predetermined level,
    wherein the control circuit further controls the other control signal to the predetermined level when the electric potential of the power line is no higher than a second electric potential being different from the first electric potential,
    wherein the control circuit further controls the other control signal to the other predetermined level when the electric potential of the power line exceeds the second electric potential, and
    wherein the control circuit includes a comparator powered by another power line.

* * * * *